(12) United States Patent
Tian et al.

(10) Patent No.: US 11,982,411 B2
(45) Date of Patent: May 14, 2024

(54) FILAMENT BASED SOLID STATE LIGHTING DEVICE

(71) Applicant: SIGNIFY HOLDING B.V., Eindhoven (NL)

(72) Inventors: Xiaogai Tian, Shanghai (CN); Xiuru Wang, Shanghai (CN); Tungching Wu, Shanghai (CN); Songhui Chen, Shanghai (CN); Yanmeng Sun, Shanghai (CN); Jiahua Yan, Shanghai (CN)

(73) Assignee: SIGNIFY HOLDINGS B.V., Eindhoven (NL)

( * ) Notice: Subject to any disclaimer, the term of this patent is extended or adjusted under 35 U.S.C. 154(b) by 0 days.

(21) Appl. No.: 18/270,588

(22) PCT Filed: Dec. 28, 2021

(86) PCT No.: PCT/EP2021/087699
§ 371 (c)(1),
(2) Date: Jun. 30, 2023

(87) PCT Pub. No.: WO2022/148689
PCT Pub. Date: Jul. 14, 2022

(65) Prior Publication Data
US 2024/0068628 A1    Feb. 29, 2024

(30) Foreign Application Priority Data

Jan. 6, 2021  (WO) ................ PCT/CN2021/070522
Feb. 25, 2021  (EP) .................................... 21159304

(51) Int. Cl.
*F21K 9/232*  (2016.01)
*F21K 9/235*  (2016.01)
(Continued)

(52) U.S. Cl.
CPC .............. *F21K 9/232* (2016.08); *F21K 9/235* (2016.08); *F21K 9/64* (2016.08); *F21K 9/90* (2013.01); *F21Y 2115/10* (2016.08)

(58) Field of Classification Search
CPC . F21K 9/232; F21K 9/64; F21K 9/235; F21K 9/90
See application file for complete search history.

(56) References Cited

U.S. PATENT DOCUMENTS

2005/0041242 A1    2/2005  Gomm et al.
2012/0306340 A1   12/2012  Hoetzl et al.
(Continued)

FOREIGN PATENT DOCUMENTS

CN          1763890 A    4/2006
CN        209012819 U    6/2019
(Continued)

*Primary Examiner* — Bryon T Gyllstrom

(57) ABSTRACT

A lighting device (1) is disclosed comprising a transmissive housing (3) and a filament (10) within said transmissive housing. The filament comprises a transmissive substrate (20) carrying a plurality of solid state lighting elements (30) and a phosphor containing resin coating (40) enveloping said filament. The resin coating includes at least one region (42) leaking light produced by said solid state lighting elements that is unconverted by said phosphor and the transmissive housing carries a further phosphor layer (7) covering part of the transmissive housing for each of said regions of the resin coating, each of said further phosphor layers being arranged to receive said unconverted light leaking from at least one of said regions. Also disclosed is a method of manufacturing such a lighting device.

15 Claims, 10 Drawing Sheets

(51) Int. Cl.
*F21K 9/64* (2016.01)
*F21K 9/90* (2016.01)
*F21Y 115/10* (2016.01)

(56) References Cited

U.S. PATENT DOCUMENTS

| | | | |
|---|---|---|---|
| 2014/0233213 A1* | 8/2014 | Frischeisen | F21V 3/00 |
| | | | 362/84 |
| 2018/0299080 A1* | 10/2018 | Jansma | F21K 9/232 |
| 2019/0128482 A1* | 5/2019 | Jiang | H05B 45/345 |
| 2019/0280168 A1* | 9/2019 | Göötz | H01L 33/505 |
| 2020/0303356 A1* | 9/2020 | Li | F21K 9/238 |
| 2021/0033247 A1* | 2/2021 | Van Bommel | H05B 45/3577 |
| 2021/0148533 A1* | 5/2021 | Van Bommel | F21S 10/04 |
| 2021/0310617 A1* | 10/2021 | Van Bommel | F21K 9/68 |
| 2022/0349530 A1* | 11/2022 | Van Bommel | F21K 9/232 |
| 2022/0390074 A1* | 12/2022 | Van Der Lubbe | F21K 9/232 |

FOREIGN PATENT DOCUMENTS

| | | |
|---|---|---|
| JP | 2015205988 A | 11/2015 |
| WO | 2020069723 A1 | 4/2020 |

\* cited by examiner

FILAMENT BASED SOLID STATE LIGHTING DEVICE

CROSS-REFERENCE TO PRIOR APPLICATIONS

This application is the U.S. National Phase application under 35 U.S.C. § 371 of International Application No. PCT/EP2021/087699, filed on Dec. 28, 2021, which claims the benefit of International Application No. PCT/CN2021/070522, filed on Jan. 6, 2021 and European Patent Application No. 21159304.1, filed on Feb. 25, 2021. These applications are hereby incorporated by reference herein.

FIELD OF THE INVENTION

The present invention relates to a lighting device comprising a transmissive housing, a filament within said transmissive housing, said filament comprising a transmissive substrate carrying a plurality of solid state lighting elements, and a phosphor containing resin coating enveloping said filament.

The present invention further relates to a method of manufacturing such a lighting device.

BACKGROUND OF THE INVENTION

Solid state lighting devices such as lighting devices based on light emitting diodes (LEDs) are rapidly replacing other forms of lighting devices such as incandescent lighting devices, halogen lighting devices, fluorescent lighting devices and the like due to the superior lifetime, robustness and energy efficiency of solid state lighting devices. Notwithstanding the clear advantages of solid state lighting devices over other types of lighting devices, several challenges still need to be overcome for solid state lighting devices to become widely accepted replacements of such other types of lighting devices.

For instance, it is not straightforward to produce a solid state lighting device that emulates the appearance and luminous output of traditional lighting devices, such as filament-based lighting devices. To this end, solid state lighting devices have been produced in which a plurality of solid state lighting elements, e.g. LEDs, are mounted on an elongate carrier mimicking a filament. For example, WO 2020/069723 A1 discloses a linear LED light source comprising a plurality of LED units conductively connected to metallic support frames, wherein the metallic support frames are configured to serve as supply conductors through which electric power for driving the LED units can be fed to the LED units.

Such filament assemblies may be coated with a phosphor containing resin coating, such that the light produced by the LEDs, e.g. blue light, may be spectrally converted by the phosphor particles in the resin, e.g. to produce white light. As is well-known per se, the color temperature of the thus produced white light may be controlled by the composition and amount of phosphor in the resin. In such filament assemblies, the elongate carrier is typically made of a light transmissive material such that light can escape the filament from virtually any part of the resin surface, thereby emulating the full 360° luminous distribution of a traditional filament-based incandescent lighting device. However, even though such a luminous distribution can be reasonably successfully emulated, it remains difficult to achieve homogeneity in the spectral composition of the light emitted from the surface of the resin enveloping the elongate carrier carrying the solid state lighting elements. Such differences can be quite noticeable, for instance when the light is projected onto a surface, or to an observer in motion, where the observer receives a luminous output emitted from different regions of the resin surface as the observer moves relative to the lighting device. In particular where such a luminous output is projected onto a surface such as a work surface, the spectral variations in the projected luminous output can become rather annoying to a person requiring adequate lighting to perform a particular task.

One particular solution to this problem would be to provide a diffusive coating on the light transmissive housing of the filament assembly. For instance, US 2018/0299080 A1 discloses an LED lamp comprising a substrate, an LED light source in optical communication with its housing, a diffusive coating applied to the housing, and a luminescent coating disposed at least partially on the diffusive coating. The luminescent coating is between the LED light source and the diffusive coating. The luminescent coating has a composition selected to achieve a particular color temperature according to a characteristic of the LED light source. However, such a solution significantly reduces the luminous efficiency of the lighting device and introduces luminescent power losses. This for example is undesirable from the perspective of achieving compliance with energy efficiency regulations, which typically require a minimum amount of lumen to be produced per Watt. For instance, for a (tubular) lighting device to achieve a Class A certification in the European Union, it needs to achieve a luminous output of 210 lm/W or more, which is difficult to achieve especially when suffering light losses at the transmissive housing, e.g. through the presence of a diffusive layer or the like.

SUMMARY OF THE INVENTION

The present invention seeks to provide a lighting device comprising a transmissive housing and a filament within said transmissive housing having a transmissive substrate carrying a plurality of solid state lighting elements that addresses at least some of the aforementioned challenges.

The present invention further seeks to provide a method of manufacturing such a lighting device.

According to examples in accordance with an aspect of the invention, there is provided a lighting device comprising a transmissive housing, a filament within said transmissive housing, said filament comprising a transmissive substrate carrying a plurality of solid state lighting elements; and a phosphor containing resin coating enveloping said filament, said resin coating including at least one region, with a reduced thickness, leaking light produced by said solid state lighting elements that is unconverted by said phosphor; wherein the transmissive housing carries a further phosphor layer covering part of the transmissive housing and being optically aligned with each of said regions of the resin coating with the reduced thickness, each of said further phosphor layers being arranged to receive said unconverted light leaking from at least one of said regions. The present invention is based on the insight that variations in the spectral composition of the luminous output of the filament with the solid state lighting elements are caused by variations in the thickness of the phosphor-containing resin coating enveloping the transmissive substrate carrying the solid state lighting elements, e.g. LEDs. Therefore, by providing a further phosphor layer on the housing for each region with a reduced thickness in the phosphor-containing resin coating such that such a further phosphor is optically aligned with such a region of the phosphor-containing resin coating having a reduced thickness, the spectral uniformity of the luminous output of the lighting device can be improved, whilst the remainder of the housing of the filament can remain transmissive, thereby improving the luminous efficiency of the lighting device as light losses, such as caused by a diffusive layer, are avoided due to the absence of such a diffusive layer covering an entire surface of the housing.

For example, the transmissive substrate may comprise a mounting surface carrying at least some of said solid state lighting elements and a pair of side surfaces at opposite sides of the mounting surface, each of said side surfaces being covered by one of said regions of the resin coating. The phosphor-containing resin coating may have a reduced thickness over the side surfaces of the transmissive substrate, such that light emitted through the regions of the phosphor-containing resin coating over these side surfaces will have a different spectral composition than light emitted through other regions of the phosphor-containing resin coating, e.g. regions covering the mounting surface of the transmissive substrate, which differences is spectral composition are compensated for by the additional phosphor layer(s) on the housing as explained above.

The transmissive substrate may contain a single mounting surface, that is, the solid state lighting elements may be mounted on a single surface of the transmissive surface only. In such a scenario, the solid state lighting elements may be dual-emitting such that the solid state lighting elements are arranged to emit light towards the transmissive substrate as well as away from it. This has the advantage that heat management of the filament can be achieved in a reasonably straightforward manner whilst achieving a luminous distribution that closely emulates a full 360° luminous distribution. Alternatively, the transmissive substrate may further comprise a further mounting surface opposing said mounting surface, said side surfaces extending between the mounting surface and the further mounting surface, wherein the solid state lighting elements may be distributed across the mounting surface and the further mounting surface.

The transmissive substrate may be made of any suitable material. In a particular example, the transmissive substrate is a sapphire substrate, but alternative materials such as a transmissive ceramic material or a flexible polymer material such as polyimide are equally feasible.

Each further phosphor layer preferably is arranged on an inner surface of the transmissive housing such as to protect the further phosphor layer from accidental damage, e.g. through scratching or the like. Alternatively, each further phosphor layer may be arranged on an outer surface of the transmissive housing, which has the advantage that the further phosphor layer(s) can be applied to the housing in a particularly straightforward manner.

The transmissive housing may be made of any suitable transmissive material. For example, the transmissive housing may be a transparent housing made of glass or plastic. In a particular set of examples, the transmissive housing is shaped as a tubular body, e.g. the lighting device may be a tubular LED (TLED) device producing a luminous output of at least 210 lm/W. In this particular set of examples, the transmissive housing may comprise a pair of said further phosphor layers each extending along said tubular body and having a radial width in a range of 60-90° such that 50-67% of the surface of the transmissive housing remains uncovered by the further phosphor layers, which ensures that the lighting device can achieve excellent luminous output efficiency.

The lighting device may comprise a plurality of said filaments extending within said tubular body; and a pair of electrode rails extending within said tubular body, wherein each filament is conductively connected to each of said electrode rails by respective support arms extending between one of said electrode rails and said filament. This allows for the filaments to be connected in parallel, which limits the resistance along the chain of filaments and therefore ensures that the filaments can be driven by a driver that is compact enough such that it can fit within the lighting device, e.g. in an end cap of the lighting device.

Where the tubular body is a plastic body, the plastic body may comprise a pair of channels in its inner surface, each of said channels extending along said tubular body and housing one of said electrode rails. This ensures that the filament assembly can be securely mounted within the tubular body, thus providing a particularly robust lighting device.

Alternatively, the filament may extend along said tubular body, i.e. substantially along its entire length, in which case the lighting device may further comprise a driver at a first end of said tubular body, said driver having a first connection to a first terminal portion of said filament proximal to said first end and a second connection to a second terminal portion of said filament proximal to a second end of said tubular body opposing said first end in order to electrically connect the filament to the driver. In this case, the lighting device may further comprise a support structure extending from said second terminal portion of the filament to said second end of the tubular body in order to secure the filament within said tubular body.

According to examples in accordance with another aspect of the invention, there is provided a method of manufacturing a lighting device, the method comprising providing a transmissive substrate, mounting a plurality of solid state lighting elements on said transmissive substrate to produce a filament, enveloping said filament with a phosphor containing resin coating, said resin coating including at least one region, with a reduced thickness, leaking light produced by said solid state lighting elements that is unconverted by said phosphor; providing a transmissive housing for said filament, forming a further phosphor layer on part of the transmissive housing for each of said regions of the resin coating with the reduced thickness; and mounting the filament in said transmissive housing by optically aligning each of said regions of said resin coating with the reduced thickness with one of said further phosphor layers such that each further phosphor layer is arranged to receive said unconverted light leaking from the region of said resin coating aligned with said further phosphor layer. A lighting device manufactured in this manner benefits from having an improved luminous efficiency owing to the use of a transmissive housing, whilst variations in the spectral output of the luminous device are reduced due to the presence of one or more further phosphor layers on the transmissive housing to convert light produced by the solid state lighting elements that is not converted by the phosphor-containing resin layer enveloping the filament.

Preferably, the transmissive housing is shaped as a tubular body and each further phosphor layer extends along said tubular body, the method further comprising forming a filament assembly by mounting a plurality of said filaments to a pair of electrode rails such that the corresponding regions of the respective filament leaking light produced by said solid state lighting elements that is unconverted by said phosphor are aligned with each other, each filament being conductively connected to each of said electrode rails by respective support arms extending between one of said electrode rails and said filament; and wherein mounting the filament in said transmissive housing comprises mounting said filament assembly in the tubular body such that said electrode rails extend along said tubular body. This has the advantage that the respective filaments can be driven in parallel, which makes it easier to achieve a desirable luminous output, e.g. a homogeneous luminous output, along the tubular housing, whilst securing the electrode rails in or against the tubular housing furthermore provides a particularly robust filament assembly within the tubular body.

Alternatively, the transmissive housing is shaped as a tubular body and each further phosphor layer extends along said tubular body, the method further comprising forming a first connection between a driver and a first terminal portion of said filament; forming a second connection between the driver and a second terminal portion of said filament opposing said first terminal portion; and wherein mounting the filament in said transmissive housing comprises mounting said filament such that said driver is located at a first end of said tubular body and said second terminal portion of said filament is located proximal to a second end of said tubular body opposing said first end, the method further comprising mounting a support structure between said second terminal portion of said filament and said second end of the tubular body. In this manner, a robust assembly of a single, elongate, filament within the tubular housing can be achieved.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
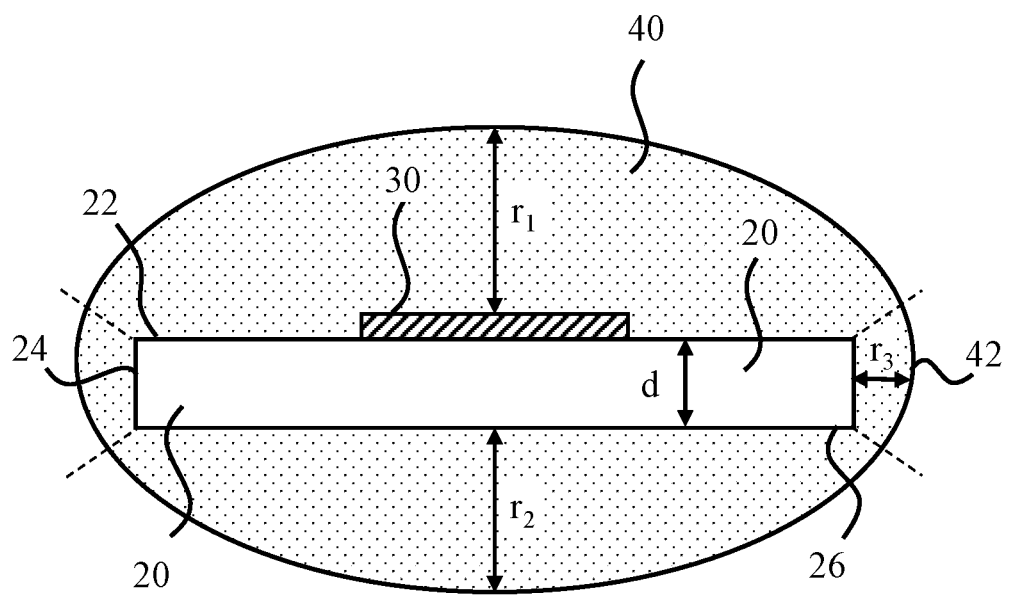
FIG. 1 schematically depicts a cross-sectional view of a resin-coated filament.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

FIG. 1 schematically depicts an example of a filament 10 that may be used in various embodiments of the lighting device of the present invention. The filament 10 comprises a transmissive substrate 20 for carrying one or more solid state lighting elements 30. The transmissive substrate 20 for example may be a transparent sapphire substrate or a transmissive ceramic substrate where a relatively rigid filament 10 is required, or may be a polymer substrate such as a polyimide substrate if the filament 10 is required to be more flexible. The solid state lighting elements 30 may take any suitable shape or form, e.g. one or more LEDs such as blue light emitting LEDs. The solid state lighting elements 30 may be mounted on a single major surface 22 of the transmissive substrate 20, in which case the solid state lighting elements 30 preferably emit light from at least two emission surfaces, e.g. towards the mounting surface 22 of the transmissive substrate 20 and away from this surface such as to provide a filament 10 that exhibits a luminous distribution emulating that of the filament of an incandescent light bulb. Alternatively, the further major surface 26 of the transmissive substrate 20 opposing the major surface 22 may also carry one or more solid state lighting elements 30 (not shown) in order to achieve the desired luminous distribution of the filament 10. In this case, the solid state lighting elements 30 may emit light from a single surface only, e.g. away from the surface on which they are mounted.

The transmissive carrier 20 carrying the solid state lighting elements 30 is typically enveloped in a resin 40 containing a phosphor, e.g. in the form of particles suspended in the resin, which phosphor converts the light emitted by the solid state lighting elements 30 into light having a different spectral composition. For example, the phosphor may convert the light emitted by the solid state lighting elements 30 into white light having a particular color temperature, which color temperature may be controlled by the chemical composition of the phosphor. Any suitable phosphor may be used for this purpose. For instance, one or more phosphors that convert blue light into yellow/green light, e.g. garnets such as YAGaG:Ce, LuAGaG:Ce, or $A_3B_5O_{12}$:Ce in which A represents a chemical element such as Y, Lu or La and B represents a chemical element such as Al, Ga, or Fe, and phosphors that convert blue light into orange/red light, e.g. alumonitridosilicate or calsin phosphors such as $CaAlSiN_3$:Eu phosphors for example, or nitridosilicates, may be used for this purpose, although it should be understood that the invention is not limited to these example phosphors and phosphors with any suitable composition may be used. The resin may be any suitable transmissive resin, preferably a transparent resin. Examples of suitable resins include ethyl type and phenyl type silicones. Other suitable resins will be immediately apparent to the skilled person.

A problem associated with the enveloping of the transmissive substrate 20 with the resin coating 40 is that the thickness of the resin coating 40 around the transmissive substrate 20 is not constant. As shown in FIG. 1, the resin coating 40 typically has a thickness $r_1$ and $r_2$ over the major surfaces 22 and 26 respectively, whereas the resin coating 40 has a significantly smaller thickness $r_3$ over the side surfaces 24 of the transmissive substrate 20 that extend between the opposing major surfaces 22 and 26. This reduced thickness $r_3$, which typically is a function of the thickness d of the transmissive substrate 20, is caused by the fact that when coating the transmissive substrate 20 carrying the solid state lighting elements 30, it is difficult to achieve the same thickness of the resin coating 40 over the side surfaces 24 compared to the major surfaces 22, 26. Consequently, light emitted by the solid state lighting elements 30 travelling through the transmissive substrate 20 and exiting this substrate through the side surfaces 24 will typically exit the filament 10 through a window 42 defined by the dashed lines extending from the side surfaces 24. As this light passes through a relatively thin layer of the resin coating 40, there is insufficient phosphor in the optical path of the light rays through this part of the resin coating 40, such that at least some of the light rays escaping from the filament 10 in this manner will be unconverted, i.e. have its original spectral composition as produced by the solid state lighting elements 30. This therefore can cause spatial variations in the spectral composition of the luminous output produced by the filament 10.

Figure 2:
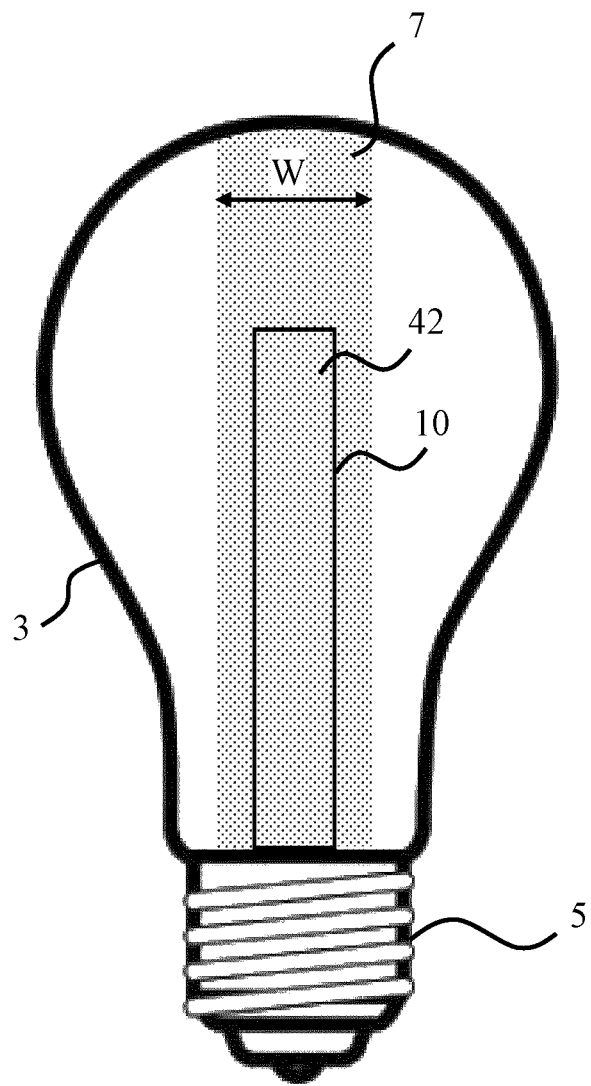
FIG. 2 schematically depicts a cross-sectional view of a lighting device according to an example.

Such spatial variations may be compensated by diffusing the luminous output, e.g. by fitting the filament 10 in a diffusive housing. However, this causes light losses and therefore compromises the optical efficiency of the lighting device including the filament 10. On the other hand, when using a transmissive housing with the filament 10, the optical efficiency of the lighting device is improved at the cost of producing a luminous output having spatial variations in its spectral composition. In accordance with the teachings of the present invention, a lighting device 1 is provided, such as the lighting device 1 schematically depicted in FIG. 2, in which the housing 3 is made of an optically transparent material such as glass or an optically transparent polymer, which housing 3 carries a further phosphor layer 7 on one of its surfaces, i.e. on an inner surface or an outer surface of the housing 3, which further phosphor layer 7 is optically aligned with the emission windows 42 such that unconverted light escaping the filament 10 fitted in the fitting or end cap 5 of the lighting device 1 is converted by the further phosphor layer 7 to improve the homogeneity in the spectral composition of the light emitted from the lighting device 1 and to improve the perceived optical efficiency of the lighting device 1 as the human eye is less sensitive to blue light, e.g. light having a wavelength of 400-450 nm than to yellow-green light, e.g. light having a wavelength of 500-550 nm such that the luminous flux as perceived by the human eye sensitivity is increased by the further phosphor layer 7.

The further phosphor layer 7 preferably has a minimal width W to ensure that large areas of the housing 3 remain transparent such that the optical efficiency of the lighting device 1 is not overly compromised by the addition of the further phosphor layer 7. The width W preferably is chosen such that only light emitted from the windows 42 is incident on the further phosphor layer 7 to ensure its width remains minimal. The further phosphor layer 7 may have any suitable chemical composition. In a particular example, the phosphor in the further phosphor layer 7 has the same chemical composition as the phosphor in the resin coating 40, although it is also feasible for the phosphor in the further phosphor layer 7 to have a different chemical composition to the phosphor in the resin coating 40. As will be readily understood by the skilled person, the thickness of the further phosphor layer 7 preferably should be chosen such that all unconverted light emitted by the filament 10 is converted when passing through the further phosphor layer 7. The further phosphor layer 7 may be a resin layer in which phosphor particles are suspended. The resin layer may have the same composition or a different composition as the resin coating 40. Of course, other carrier materials for the phosphor in the further phosphor layer 7 may also be contemplated.

Figure 3:
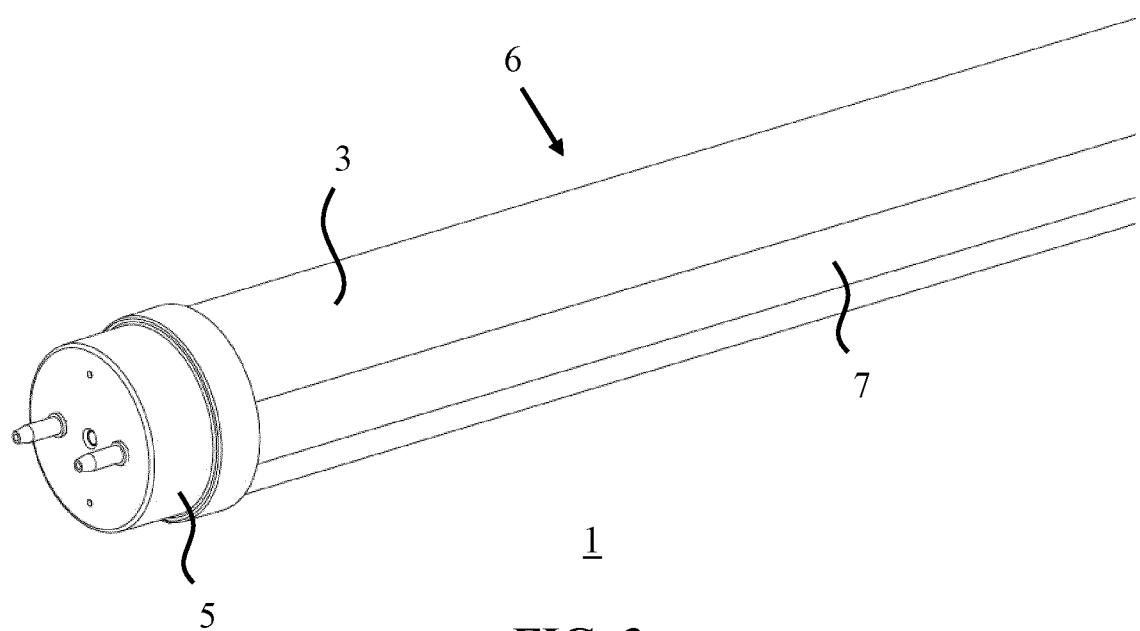
FIG. 3 schematically depicts a perspective view of a lighting device according to another example.

A particular class of lighting devices that may benefit from the teachings of the present invention is tubular light devices. FIG. 3 schematically depicts such lighting device 1 in which the housing 3 has a tubular body 6, with the filament 10 (not shown) extending in the elongation direction of the tubular body 6. In such a scenario, the further phosphor 7 typically also extends in the elongation direction of the tubular body 6, e.g. on an inner surface or an outer surface of the tubular body 6, which tubular body 6 may carry a plurality of such further phosphor layers 7, typically one further phosphor layer 7 for each window 42 of the filament 10. For example, where the filament 10 comprises two such windows 42, as for instance is the case when using a rectangular transmissive substrate 20, two further phosphor layers 7 will extend along the elongation direction of the tubular body 6 such that each window 42 is optically aligned with one of the further phosphor layers 7. The use of a filament 10 in such a tubular lighting device 1 ensures that the lighting device can produce a 360° luminous distribution, contrary to tubular lighting devices deploying solid state lighting elements where the solid state lighting elements are mounted on a carrier that itself is mounted on part of the surface of the tubular body 6 such that this part of the tubular body 6 is prevented from transmitting light generated by the solid state lighting elements. In order to make such a luminous distribution more omnidirectional, the tubular body 6 typically carries a diffusive layer or the like, but this reduces the optical efficiency of such a tubular lighting device as previously explained.

Figure 4:
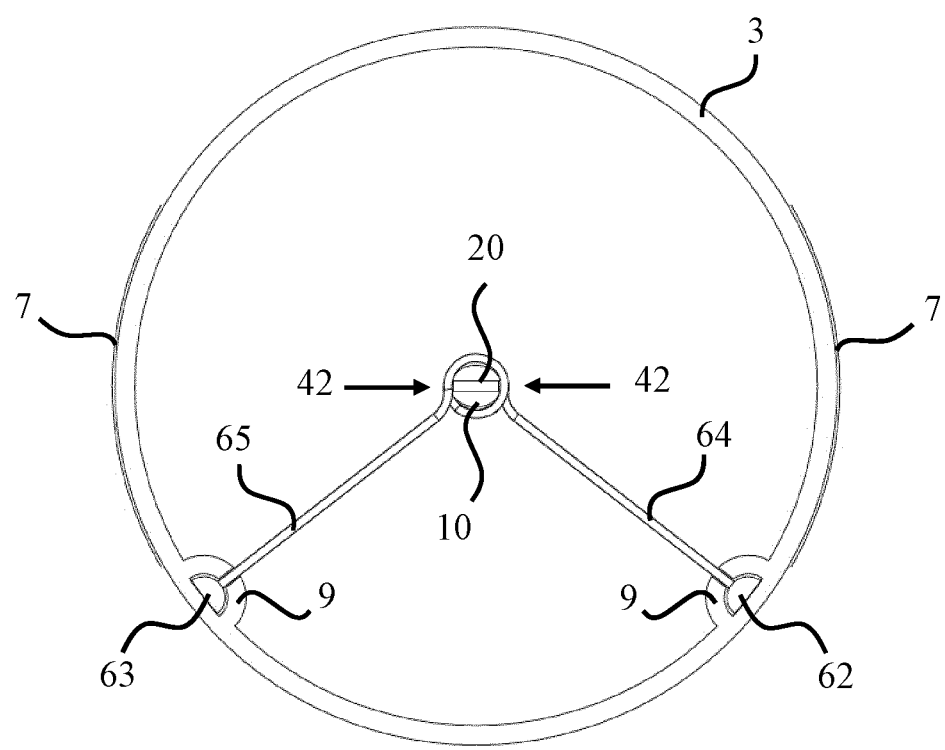
FIG. 4 schematically depicts a cross-sectional view of the lighting device of FIG. 3.
Figure 5:
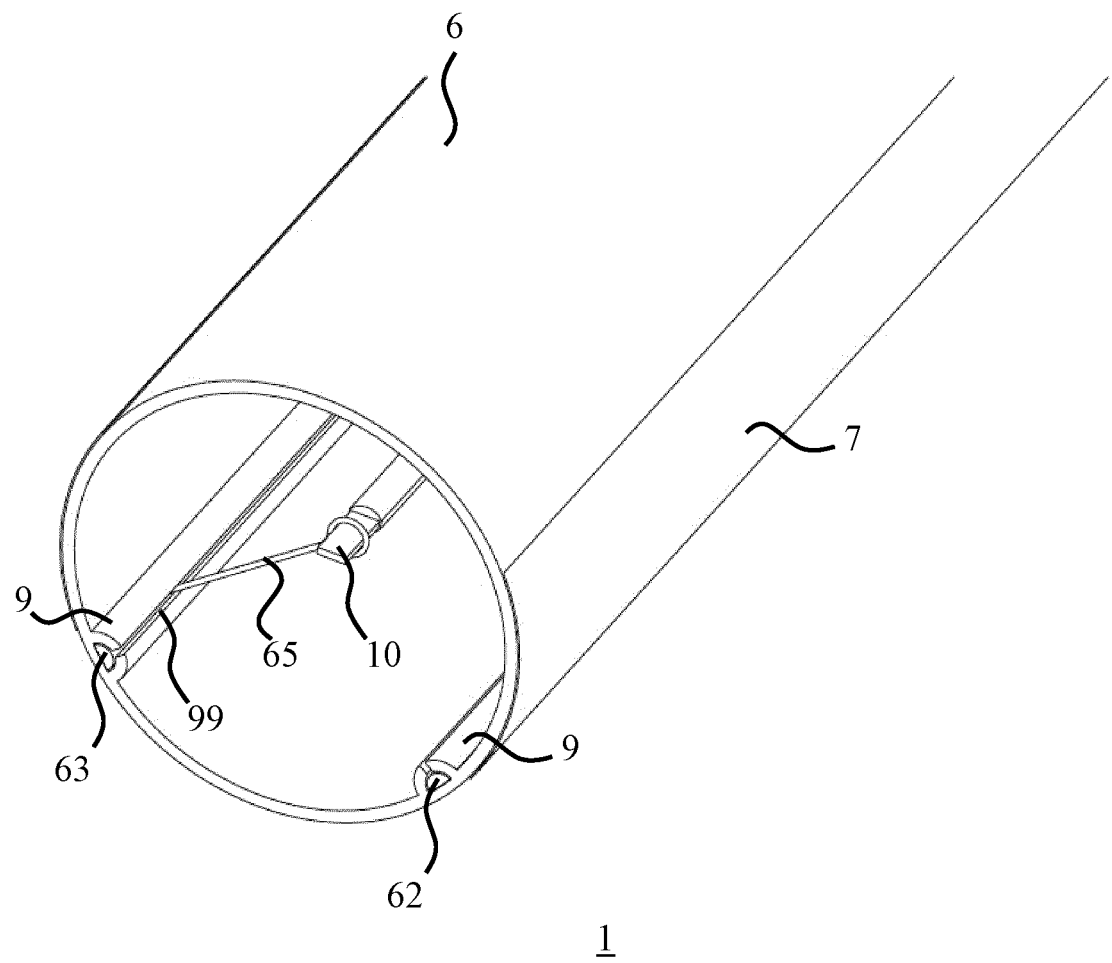
FIG. 5 schematically depicts a perspective view of a lighting device of FIG. 3.

FIG. 4 schematically depicts an example of how the filament 10 may be mounted in the transmissive housing 3. The transmissive housing 3 may comprise a pair of channels 9 into which electrode rails 62, 63 may be mounted, which electrode rails are conductively coupled to the filament 10 through support arms 64, 65, e.g. support wires or the like, that suspend the filament 10 within the transmissive housing 3. For example, the respective electrode rails 62, 63 may be slid into the channels 9 when mounting the filament 10 within the tubular body 6, i.e. within the transmissive housing 3. This is more clearly shown in FIG. 5, which shows the channels 9 to comprise a slot 99 through which the support arms 64, 65 can extend from the electrode rails 62, 63 embedded in the channels 9 to the filament 10. The channels 9 may be formed in the transmissive housing 3 in any suitable manner. For example, where the transmissive housing 3 comprises a plastic tubular body 6, the channels 9 may be formed in the plastic tubular body 6 when molding the plastic tubular body 6.

Of course, the electrode rails 62, 63 may be mounted within the tubular body 6 in any suitable manner. For example, where such channels 9 are more difficult to achieve, e.g. in case of a glass tubular body 6, the electrode rails 62, 63 may be adhered to the inner surface of the tubular body 6 instead. This for instance may be achieved using a UV-activated adhesive or any other suitable type of adhesive. In case of a UV-activated adhesive, the electrode rails 62, 63 may be coated or with such an adhesive and positioned within the tubular body 6 after which the tubular body 6 is exposed to UV radiation in order to activate the adhesive and secure the electrode rails 62, 63 against the tubular body 6. Alternatively, at least part of the inner surface of the tubular body 6 may be coated with such an adhesive and activated with UV light once the electrode rails 62, 63 have been positioned within the tubular body 6. Other suitable ways of securing the electrode rails 62, 63 against the tubular body 6 will be apparent to the skilled person.

Figure 6:
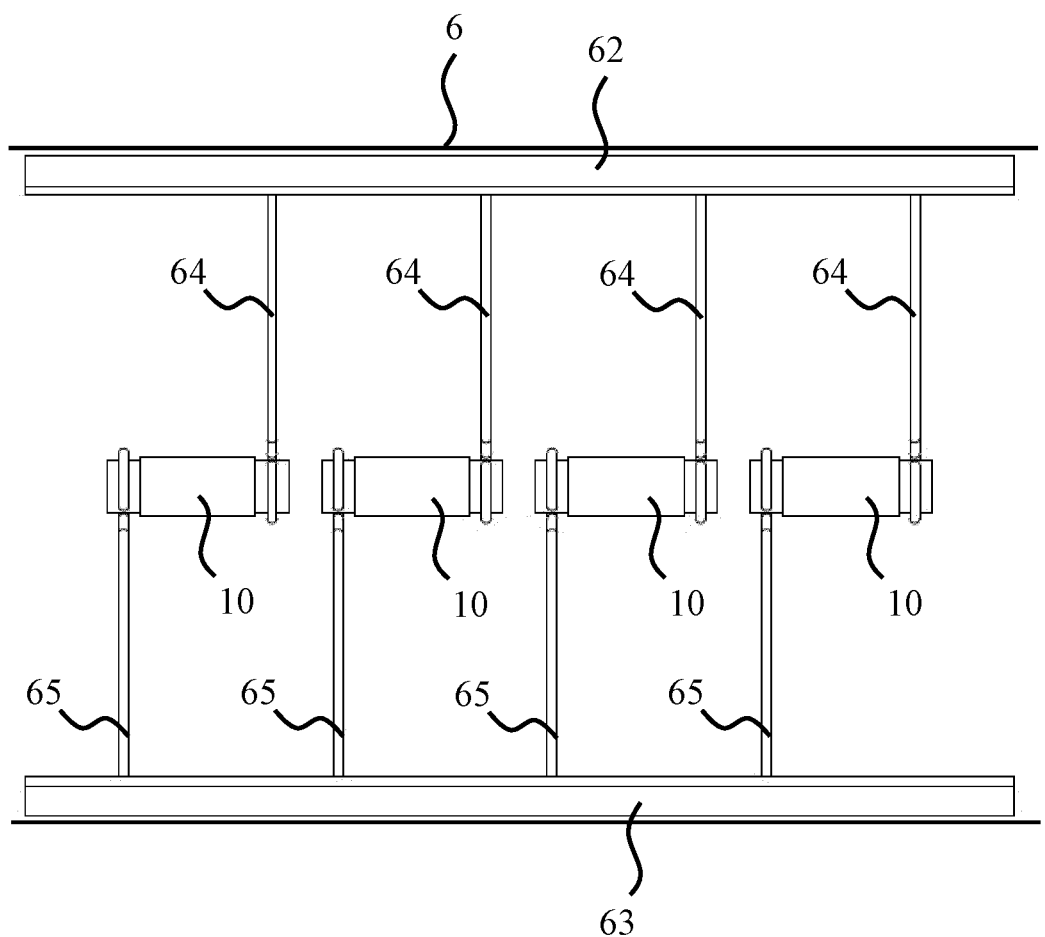
FIG. 6 schematically depicts a cross-sectional view of the lighting device according to at least some examples.
Figure 7:
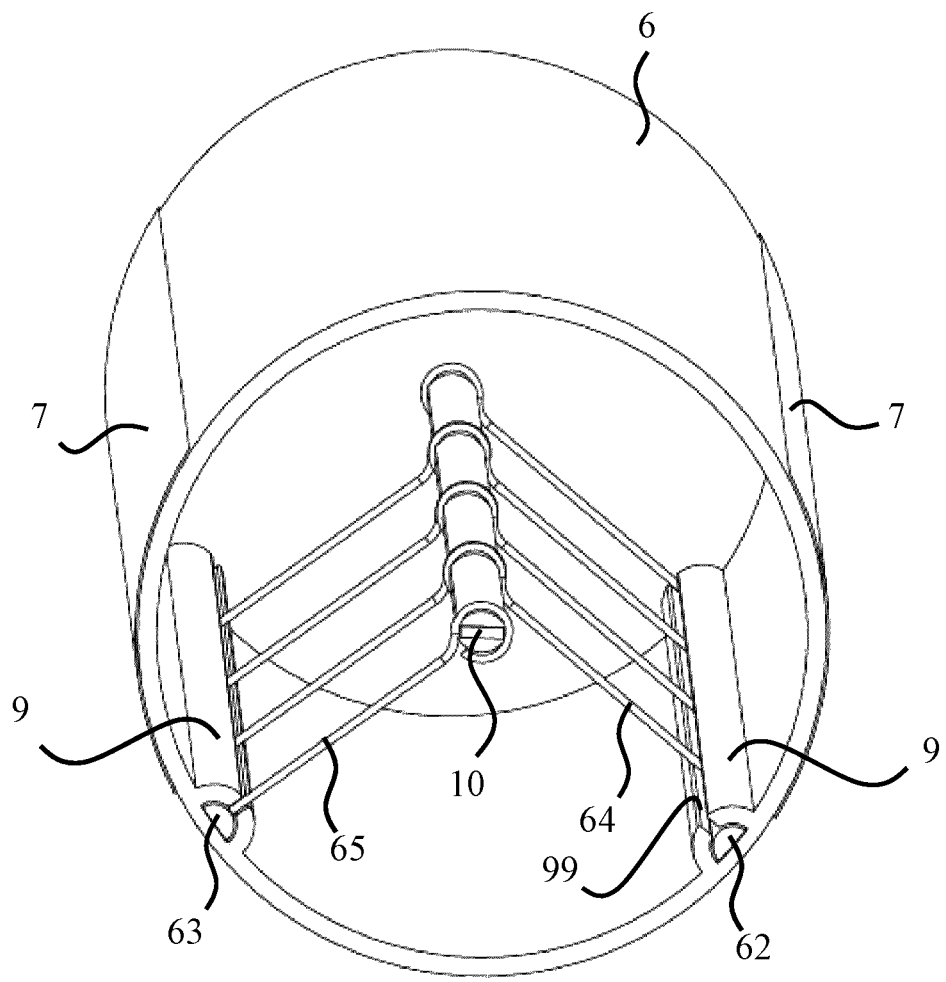
FIG. 7 schematically depicts a perspective view of the lighting device of FIG. 6.

The filament 10 in some examples may consist of a plurality of filaments 10 as schematically depicted in FIGS. 6 and 7, in which each filament 10 is connected to the electrode rails 62, 63 through respective support arms 64, 65. For example, each filament 10 may extend in between a pair of support arms 64, 65. This has a number of advantages. Firstly, it allows for the respective filaments 10 to be connected to the electrode rails 62, 63 in parallel, thus lowering the resistance encountered when driving the solid state lighting elements 30 along the respective filaments 10. Consequently, the requirements for the driver of the solid state lighting elements 30 are less demanding, for instance because of a smaller voltage drop across the solid state lighting elements 30 extending along the tubular body 6 due to this parallel connection of the filaments 10. This means that the driver can be smaller, which makes it easier to fit the driver in an end cap of the tubular body 6. Secondly, using multiple smaller filaments 10 rather than a single filament 10 extending along the entire tubular body 6 makes it easier to achieve a robust lighting device 1.

Figure 8:
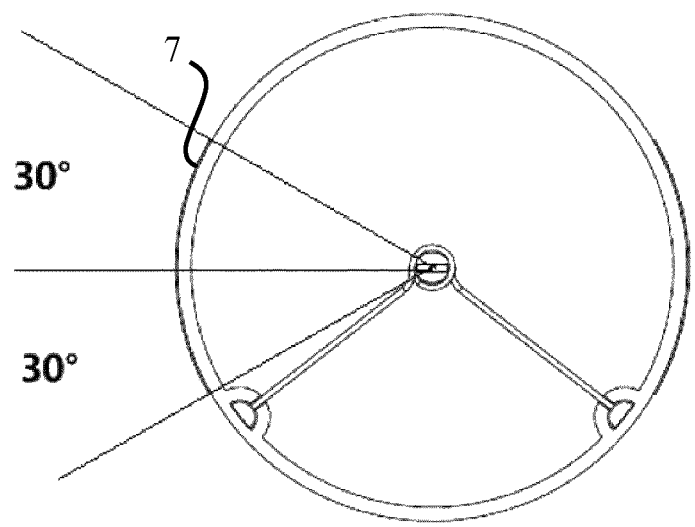
FIG. 8 schematically depicts a cross-sectional view of a design aspect of the lighting device according to at least some examples.
Figure 9:
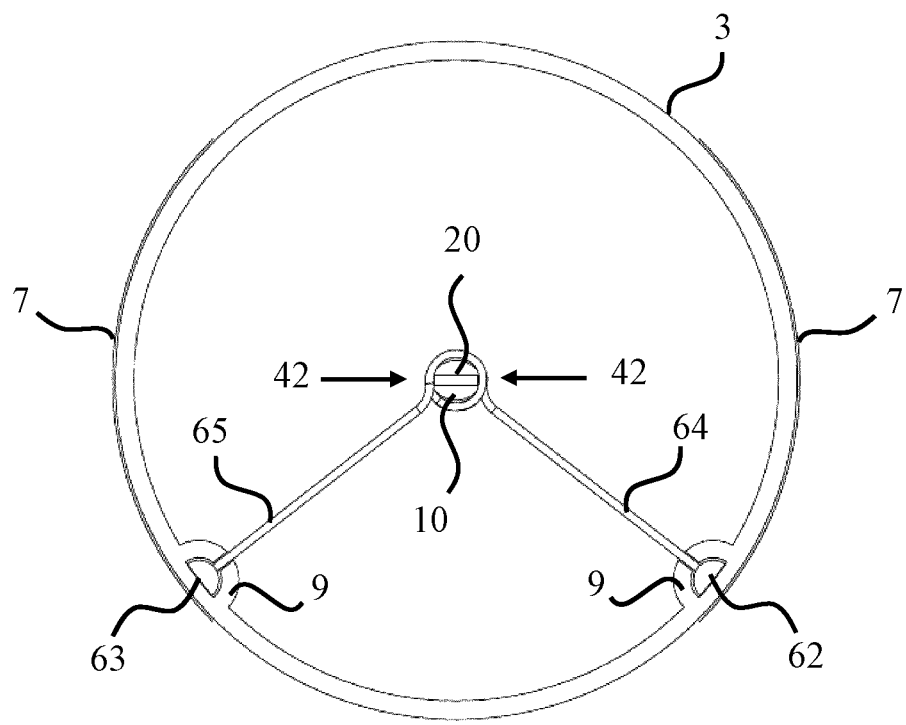
FIG. 9 schematically depicts a cross-sectional view of a lighting device according to at least some alternative examples.

The further phosphor layers 7 are optically aligned with the windows 42 at the side surfaces of the transmissive carrier 20 within the filament 10. Although the further phosphor layers 7 are shown on the outer surface of the transmissive housing 3, it is reiterated that the further phosphor layers 7 may also be located on the inner surface of the transmissive housing 3, where they are less prone to accidental damage, e.g. through scratching of the outer surface of the transmissive housing 3 although where such accidental damage is of limited concern, the positioning of the further phosphor layers 7 on the outer surface of the transmissive housing 3 may be more cost-effective. In a particular example, each further phosphor layer 7 covers a portion of the tubular body 6 having a radial width in a range of 60-90°. For example, FIG. 8 schematically depicts a cross-sectional view of a tubular lighting device 1 in which the radial width of the further phosphor layer 7 is 60°, as indicated by the pair of 30° sections on either side of the horizontal plane dissecting the further phosphor layer 7, whereas in FIG. 9 each further phosphor layer 7 has a radial width of 90°. As previously explained, the (radial) width W of each further phosphor layer 7 is typically chosen such that all unconverted light emitted through the windows 42 facing the side surfaces of the transmissive substrate 20 within the filament 10 is incident on such a further phosphor layer 7, with the actual width W being a function of the dimensions and positioning of the filament 10 within the transmissive housing 3, such as the thickness d of the transmissive substrate 20.

Figure 10:
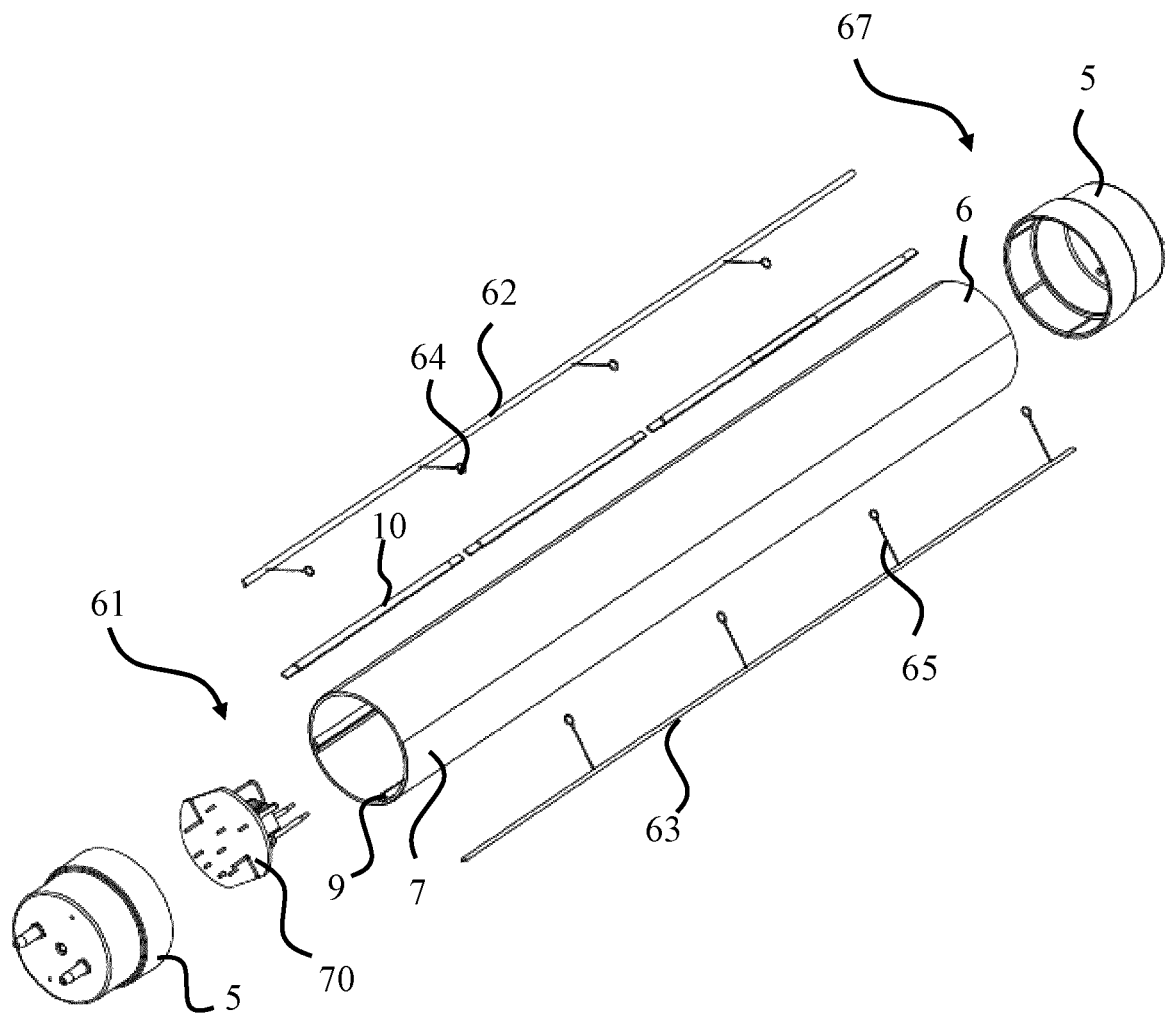
FIG. 10 schematically depicts an exploded view of a lighting device according to at least some examples.

FIG. 10 schematically depicts an exploded view of an example tubular lighting device 1 according to the present invention. The one or more filaments 10 typically extend between opposing end caps 5 that fit onto the opposing ends 61, 67 of the transmissive, or more preferable transparent, tubular body 6, with at least one of the end caps 5 housing a driver arrangement 70 for the one or more filaments 10. Preferably, as previously explained, where multiple filaments 10 are present within the transparent tubular housing 6, the filaments 10 are connected in parallel to electrodes rails 62, 63 via support arms 64, 65, which electrode rails 62, 63 may be fitted within channels 9 inside the tubular body 6. This reduces the voltage that the driver arrangement 70 has to provide owing to a smaller voltage drop across the solid state lighting elements 30 on the filaments 10 along the tubular body 6, such that the driver arrangement 70 can be kept compact, making it easier to fit the driver arrangement 70 into an end cap 5. It is furthermore reiterated that although the further phosphor layer 7 is shown on the outer surface of the tubular body 6, it is equally feasible for the further phosphor layer 7 to be situated on the inner surface of the tubular body 6.

Figure 11:
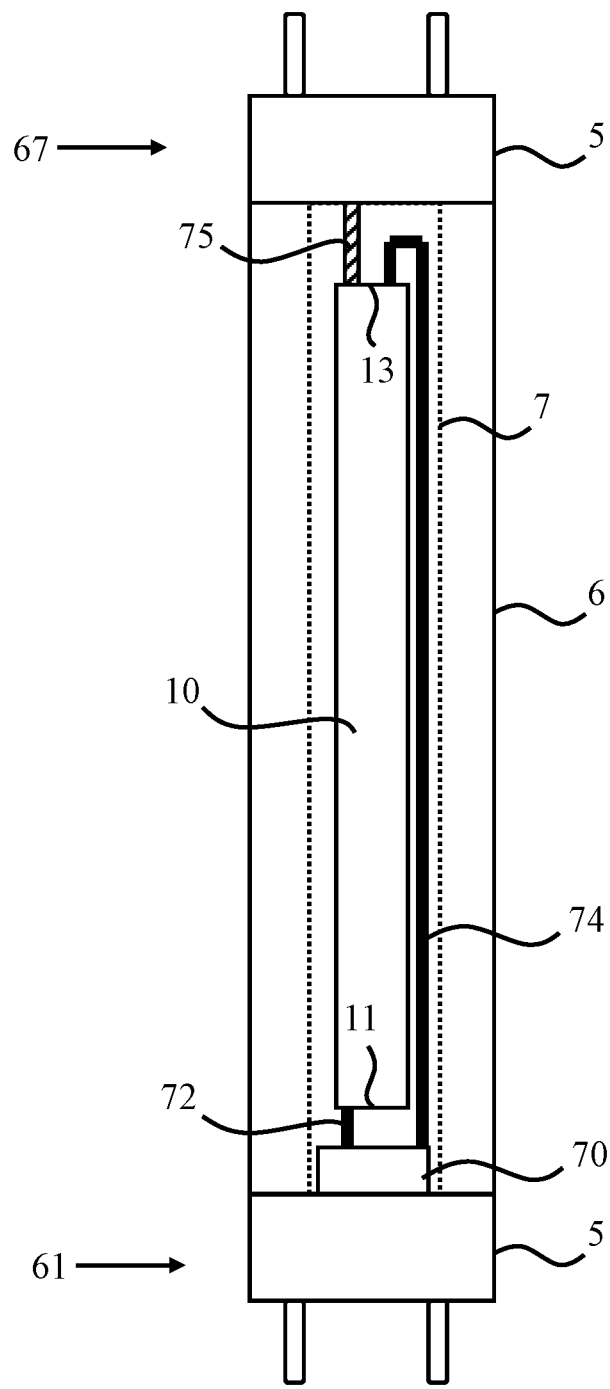
FIG. 11 schematically depicts a cross-sectional view of the lighting device according to yet another example.

FIG. 11 schematically depicts an alternative example of a tubular lighting device 1 of the present invention, in which a single filament 10 extends along the tubular body 6 such that a first end 11 of the single filament 10 is arranged proximal to the end portion 61 of the tubular body 6 and the opposite second end 13 of the single filament 10 is arranged proximal to the opposite end portion 67 of the tubular body 6. The filament 10 may be supported within the tubular body 6 in any suitable manner. For example, the filament 10 may be wedged in between the opposing end caps 5, or the filament 10 may be supported by the driver arrangement 70 at the first end 61 of the tubular body 6 and by a support member 75 extending from the end portion 13 of the filament and the end cap 5 at the opposing end 67 of the tubular body 6.

The driver arrangement 70 may be mounted in any suitable location, e.g. within the end cap 5 at the end portion 61 of the tubular body 6. In this example, the driver arrangement 60 is electrically connected to the filament 10 through a first connection 72 at the first end 11 of the filament 10 and through a second connection 74 that extends from the driver arrangement 70 to the second end 13 of the filament 10. The second connection 74 may be a separate wire or the like or may be a conductive track running over the transmissive substrate 20 of the filament 10, e.g. over a side surface 24 or the major surface 26 opposing the mounting surface 22 carrying the solid state lighting elements 30. Alternatively, the conductive track may run over the inner surface of the tubular body 6, in which case the conductive track preferably is made of an optically transparent conductive material such as Indium Tin Oxide such that the conductive track does not interfere with the luminous distribution of the tubular lighting device 1.

Figure 12:
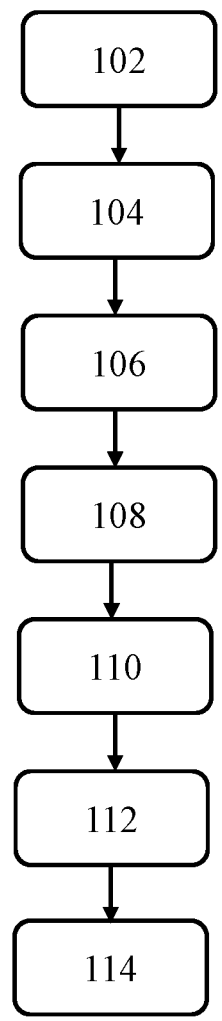
FIG. 12 is a flowchart of an example assembly method of the example lighting devices.

The lighting device 1 according to the embodiments of the present invention may be manufactured in accordance with a manufacturing method 100, a flow chart of which is shown in FIG. 12. The method 100 starts in operation 102 with the provision of a transmissive substrate 20, e.g. a transparent sapphire substrate, a transmissive white ceramic substrate, a polymer substrate such as a polyimide substrate or the like, onto which a plurality of solid state lighting elements 30 are mounted in operation 104 to produce a filament 10. The solid state lighting elements 30 may be mounted onto the transmissive substrate 20 in any suitable manner, and as such mounting techniques are well-known per se, this will not be explained in further detail for the sake of brevity only.

Next, the filament 10 is enveloped with a phosphor containing resin coating 40 in operation 106, e.g. by dipping the filament 10 in a bath containing said coating or in any other suitable manner. As explained in more detail previously, the resin coating 40 will typically include at least one region 42, e.g. two regions or windows 42 facing the side walls 24 of the transmissive substrate 20, that will leak light produced by the solid state lighting elements 30 that is unconverted by the phosphor in the resin coating 40 when the filament 10 is in use. A transmissive housing 3, e.g. a glass housing or plastic housing, which may take the shape of a tubular body 6 in preferred examples, is provided in operation 108 into which the filament 10 is to be mounted.

A further phosphor layer 7 is formed on part of the transmissive housing 3 in operation 110 such that each of the regions or windows 42 of the resin coating 40 can be optically aligned with a further phosphor layer 7. For instance, in case of a bulbous transmissive housing 3, a single further phosphor layer 7 may be formed extending across the bulbous transmissive housing 3 such that an opposing pair of regions or windows 42 of the resin coating 40 may be optically aligned with different section of the single further phosphor layer 7. Alternatively, in case of the tubular transmissive housing 3, a pair of further phosphor layers 7 may be formed extending along the elongation direction of the tubular transmissive housing 3 such that each of the regions or windows 42 of the resin coating 40 may be optically aligned with one of the further phosphor layers 7. As will be understood from the foregoing, the one or more further phosphor layers 7 are dimensioned based on the dimensions of the filament 10, e.g. the thickness d of the transmissive substrate 20, and the positioning of the filament 10 within the transmissive housing 3. The further phosphor layer 7 may be formed on a section of an inner or outer surface of the transmissive housing 3 in any suitable manner, e.g. using conventional masking techniques. For example, the tubular body 6 may be partially filled with a D-shaped plug leaving exposed the section on which the further phosphor layer 7 is to be formed. The exposed section is subsequently filled with a liquid resin containing the further phosphor(s) until this liquid reaches the plug, after which the resin is cured (e.g. using a hot air stream or UV light, depending on the type of resin), and the plug is removed from the tubular body 6, such as disclosed in CN 1763890 A for example.

Finally, the filament 10 is mounted in the transmissive housing 3 in operation 112 before the method 100 terminates in operation 114. In operation 112, the filament 10 may be mounted in the transmissive housing 3 by aligning each of the regions 42 of the resin coating with a further phosphor layer 7 on the transmissive housing 3 such that each further phosphor layer 7 is optically aligned with one or more of the regions 42 of the resin coating 42 such that the further phosphor layer 42 is arranged to receive said unconverted light leaking from the region 42 of the resin coating 40. The filament 10 may be supported by the end cap 5 and extend from this end cap 5 into the transmissive housing 3 in case of a bulbous transmissive housing 3.

Where the transmissive housing 3 is shaped as a tubular body 6 such that each further phosphor layer 7 extends along the tubular body, the method 100 may further comprise forming a filament assembly by mounting a plurality of the filaments 10 onto a pair of electrode rails 62, 63 such that the corresponding regions 42 of the respective filament leaking light produced by the solid state lighting elements 30 that is unconverted by said phosphor are aligned with each other. Each filament 10 in this filament arrangement may be conductively connected to each of the electrode rails 62, 63 by respective support arms 64, 65 extending between the electrode rails 62, 63 and the filament 10. In this case, operation 112 further comprises mounting the filament assembly in the tubular body 6 such that the electrode rails 62, 63 extend along the tubular body, e.g. by sliding the electrode rails 62, 63 in the channels 9 or by adhering the electrode rails 62, 63 to the inner surface of the tubular body 6 once the electrode rails 62, 63 are positioned within the tubular body 6.

Alternatively, where a single filament 10 is to be mounted in such a tubular body 6, e.g. a filament 10 substantially extending along the length of the tubular body 6, operation 112 of the method 100 may further comprise forming a first connection 72 between a driver 70 and a first terminal portion 11 of the filament 10 and forming a second connection 74 between the driver 70 and a second terminal portion 13 of the filament 10 opposing its first terminal portion 11. In this case, mounting the filament 10 in the tubular body 6 may further comprise mounting the filament 10 such that the driver 70 is located at a first end 61 of the tubular body 6 and the second terminal portion 13 of the filament 10 is located proximal to a second end 67 of the tubular body 10 opposing its first end 61 and mounting a support structure 75 between the second terminal portion 13 of the filament 10 and the second end 67 of the tubular body 6, e.g. between the second terminal portion 13 of the filament 10 and an end cap 5 at the second end 67 of the tubular body 6 such as to stabilize the filament 10 within the tubular body 6.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A lighting device comprising:
   a transmissive housing;
   a filament within said transmissive housing, said filament comprising a transmissive substrate carrying a plurality of solid state lighting elements; and
   a phosphor containing resin coating enveloping said filament, said resin coating including at least one region, with a reduced thickness, leaking light produced by said solid state lighting elements that is unconverted by said phosphor;
   wherein the transmissive housing carries a further phosphor layer covering a part of the transmissive housing and being optically aligned with each of said regions of the resin coating with the reduced thickness, each of said further phosphor layers being arranged to receive said unconverted light leaking from at least one of said regions, whilst other part of the housing remains transmissive.

2. The lighting device of claim 1, wherein the transmissive substrate comprises a mounting surface carrying at least some of said solid state lighting elements and a pair of side surfaces at opposite sides of the mounting surface, each of said side surfaces being covered by one of said regions of the resin coating.

3. The lighting device of claim 2, wherein:
   the transmissive substrate further comprises a further mounting surface opposing said mounting surface, said side surfaces extending between the mounting surface and the further mounting surface; and the solid state lighting elements are distributed across the mounting surface and the further mounting surface.

4. The lighting device of claim 1, wherein the transmissive substrate is a sapphire substrate.

5. The lighting device of claim 1, wherein each further phosphor layer is arranged on an inner surface or an outer surface of the transmissive housing.

6. The lighting device of claim 1, wherein the transmissive housing is a transparent housing made of glass or plastic.

7. The lighting device of claim 1, wherein the transmissive housing is shaped as a tubular body.

8. The lighting device of claim 7, wherein the transmissive housing comprises a pair of said further phosphor layers each extending along said tubular body and having a radial width in a range of 60-90°.

9. The lighting device of claim 7, further comprising:
   a plurality of said filaments extending within said tubular body; and
   a pair of electrode rails extending within said tubular body, wherein each filament is conductively connected to each of said electrode rails by respective support arms extending between one of said electrode rails and said filament.

10. The lighting device of claim 9, wherein the tubular body is a plastic body comprising a pair of channels in its inner surface, each of said channels extending along said tubular body and housing one of said electrode rails.

11. The lighting device of claim 7, wherein the filament extends along said tubular body, the lighting device further comprising a driver at a first end of said tubular body, said driver having a first connection to a first terminal portion of said filament proximal to said first end and a second connection to a second terminal portion of said filament proximal to a second end of said tubular body opposing said first end.

12. The lighting device of claim 11, further comprising a support structure extending from said second terminal portion of the filament to said second end of the tubular body.

13. A method of manufacturing a lighting device, the method comprising:
   providing a transmissive substrate;
   mounting a plurality of solid state lighting elements on said transmissive substrate to produce a filament;
   enveloping said filament with a phosphor containing resin coating, said resin coating including at least one region, with a reduced thickness, leaking light produced by said solid state lighting elements that is unconverted by said phosphor;
   providing a transmissive housing for said filament;
   forming a further phosphor layer on a part of the transmissive housing for each of said regions of the resin coating with the reduced thickness, whilst other part of the housing remains transmissive; and
   mounting the filament in said transmissive housing by optically aligning each of said regions of said resin coating with the reduced thickness with one of said further phosphor layers such that each further phosphor layer is arranged to receive said unconverted light leaking from the region of said resin coating aligned with said further phosphor layer.

14. The method of claim 13, wherein the transmissive housing is shaped as a tubular body and each further phosphor layer extends along said tubular body, the method further comprising:
   forming a filament assembly by mounting a plurality of said filaments to a pair of electrode rails such that the corresponding regions of the respective filament leaking light produced by said solid state lighting elements that is unconverted by said phosphor are aligned with each other, each filament being conductively connected to each of said electrode rails by respective support arms extending between one of said electrode rails and said filament; and
   wherein mounting the filament in said transmissive housing comprises mounting said filament assembly in the tubular body such that said electrode rails extend along said tubular body.

15. The method of claim 13, wherein the transmissive housing is shaped as a tubular body and each further phosphor layer extends along said tubular body, the method further comprising:
   forming a first connection between a driver and a first terminal portion of said filament;
   forming a second connection between the driver and a second terminal portion of said filament opposing said first terminal portion; and
   wherein mounting the filament in said transmissive housing comprises mounting said filament such that said driver is located at a first end of said tubular body and said second terminal portion of said filament is located proximal to a second end of said tubular body opposing said first end, the method further comprising:
   mounting a support structure between said second terminal portion of said filament and said second end of the tubular body.

* * * * *